(12) United States Patent
Westerman

(10) Patent No.: US 11,587,834 B1
(45) Date of Patent: Feb. 21, 2023

(54) PROTECTIVE COATING FOR PLASMA DICING

(71) Applicant: Plasma-Therm LLC, St. Petersburg, FL (US)

(72) Inventor: Russell Westerman, Land O'Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 36 days.

(21) Appl. No.: 17/313,188

(22) Filed: May 6, 2021

Related U.S. Application Data

(60) Provisional application No. 63/045,517, filed on Jun. 29, 2020.

(51) Int. Cl.
| | |
|---|---|
| *H01L 21/78* | (2006.01) |
| *H01L 21/3065* | (2006.01) |
| *H01L 21/683* | (2006.01) |
| *H01L 23/544* | (2006.01) |

(52) U.S. Cl.
CPC .......... *H01L 21/78* (2013.01); *H01L 21/3065* (2013.01); *H01L 21/6835* (2013.01); *H01L 21/6836* (2013.01); *H01L 23/544* (2013.01); *H01L 2221/6834* (2013.01); *H01L 2221/68327* (2013.01); *H01L 2223/5446* (2013.01)

(58) Field of Classification Search
CPC . H01L 21/78; H01L 21/3065; H01L 21/6835; H01L 21/6836; H01L 23/544; H01L 2221/68327; H01L 2221/6834; H01L 2223/5446

USPC .......................................................... 438/462
See application file for complete search history.

(56) References Cited

U.S. PATENT DOCUMENTS

| | | | |
|---|---|---|---|
| 7,479,516 B2 * | 1/2009 | Chen | B82Y 30/00 |
| | | | 423/445 B |
| 9,082,839 B2 * | 7/2015 | Gauldin | H01L 21/30655 |
| 10,903,121 B1 * | 1/2021 | Park | H01L 21/3065 |
| 2016/0075871 A1 * | 3/2016 | Morita | H01L 24/81 |
| | | | 525/481 |
| 2020/0381304 A1 * | 12/2020 | Saeki | H01L 21/78 |

* cited by examiner

*Primary Examiner* — Vu A Vu
(74) *Attorney, Agent, or Firm* — Burr & Forman LLP; Harvey S. Kauget

(57) ABSTRACT

The present invention provides a method for an improved protective coating for plasma dicing a substrate. A work piece having a support film, a frame and the substrate, the substrate having a top surface and a bottom surface, the top surface of the substrate having a plurality of device structures and a plurality of street areas is provided. The work piece is formed by adhering the substrate to a support film and then mounting the substrate with the support film to a frame. A composite material coating having a matrix component and a filler component is applied to the top surface of the substrate. The filler component has a plurality of particles. The composite material coating is removed from at least one street area to expose the street area. The exposed street area is plasma etched. The composite material coating is removed from the top surface of the substrate.

16 Claims, 7 Drawing Sheets

PROTECTIVE COATING FOR PLASMA DICING

CROSS REFERENCES TO RELATED APPLICATIONS

This application claims priority from and is related to commonly owned U.S. Provisional Patent Application Ser. No. 63/045,517 filed Jun. 29, 2020, entitled: IMPROVED PROTECTIVE COATING FOR PLASMA DICING, this Provisional Patent Application incorporated by reference herein.

FIELD OF THE INVENTION

The invention relates to the use of a plasma apparatus for the formation of individual device chips from a semiconductor substrate, and in particular to an improved method for coating substrates that are plasma etched into individual die.

BACKGROUND OF THE INVENTION

Semi-conductor devices are fabricated on substrates which are in the form of thin wafers. Silicon is commonly used as the substrate material, but other materials, such as III-V compounds (for example GaAs and InP) are also used. In some instances (for example, the manufacture of LED's) the substrate is a sapphire or silicon carbide wafer on which a thin layer of a semi-conducting material is deposited. The size of such substrates ranges from two inches and three inches up to two hundred millimeters and three hundred millimeters diameter and many standards exist (e.g., SEMI) to describe such substrate sizes.

After fabrication on the substrate, the individual devices (die or chips) are separated from each other prior to packaging or being employed in other electronic circuitry. For many years, mechanical means have been used to separate the die from each other. Such mechanical means have included breaking the wafer along scribe lines aligned with the substrate crystal axis or by using a high speed diamond saw to saw into or through the substrate in a region (streets) between the die. More recently, lasers have been used to facilitate the scribing process.

Recently plasma etching techniques have been proposed as a means of separating die and overcoming some of these limitations. After device fabrication, the substrate is masked with a suitable mask material, leaving open areas between the die. The masked substrate is then processed using a reactive gas plasma which etches the substrate material exposed between the die. However, the reactive gas plasma also etches the mask material. For thicker substrates, the selectivity of the etching of the substrate material to the mask material needs to be improved.

Therefore, what is needed is an improved protective film that has a higher selectivity of etching in the reactive gas plasma to the substrate material.

Nothing in the prior art provides the benefits attendant with the present invention.

Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method for an improved protective coating for plasma dicing a substrate, the method comprising: providing a work piece having a support film, a frame and the substrate, the substrate having a top surface and a bottom surface, the top surface of the substrate having a plurality of device structures and a plurality of street areas; applying a composite material coating to the top surface of the substrate; removing said composite material coating from at least one street area to expose the street area; plasma etching the exposed street area; and removing said composite material coating from the top surface of the substrate.

Yet another object of the present invention is to provide a method for an improved protective coating for plasma dicing a substrate, the method comprising: providing a work piece having a support film, a frame and the substrate, the substrate having a top surface and a bottom surface, the top surface of the substrate having a plurality of device structures and a plurality of street areas; applying a composite material coating to the top surface of the substrate, said composite material coating having a matrix component and a filler component; removing said composite material coating from at least one street area to expose the street area; plasma etching the exposed street area; and removing said composite material coating from the top surface of the substrate.

Still yet another object of the present invention is to provide a method for an improved protective coating for plasma dicing a substrate, the method comprising: providing a work piece having a support film, a frame and the substrate, the substrate having a top surface and a bottom surface, the top surface of the substrate having a plurality of device structures and a plurality of street areas; applying a composite material coating to the top surface of the substrate, said composite material coating having a matrix component and a filler component, said filler component having a plurality of particles; removing said composite material coating from at least one street area to expose the street area; plasma etching the exposed street area; and removing said composite material coating from the top surface of the substrate.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a charged particle source for arc prevention and stable operation of ion source in processing of diamond-like carbon (DLC) films.

Another feature of the present invention is to provide a method for an improved protective coating for plasma dicing a substrate. The substrate can have a semiconducting layer such as Silicon and/or the substrate can have a III-V layer such as GaAs. A work piece having a support film, a frame and the substrate, the substrate having a top surface and a bottom surface, the top surface of the substrate having a plurality of device structures and a plurality of street areas is provided. The work piece is formed by adhering the substrate to a support film and then mounting the substrate with the support film to a frame. The support film can have a polymer layer and/or a conductive layer. The support film can be standard dicing tape. The frame can have a conductive layer and/or a metal layer. A composite material coating is applied to the top surface of the substrate. The composite material coating can further comprise a matrix component and a filler component. The matrix component can further comprise a carbon containing material and/or a polymer material. The matrix component can be water soluble. The matrix component can further comprise a poly acrylic acid. The matrix component can further comprise dextran. The matrix component can further comprise a poly methacrylic acid. The matrix component can further comprise a poly acrylamide. The matrix component can further comprise a poly ethylene imine. The matrix component can further comprise a poly vinyl alcohol. The filler component cannot be water soluble. The filler component can further comprise a carbon containing material. The matrix component can be selected from the group consisting of graphite, diamond and silicon carbide. The filler component can further comprise a silicon containing material. The matrix component can be selected from the group consisting of silicon nitride, silicon dioxide, silicon oxynitride and silicon carbide. The filler component can further comprise particles. The composite material coating is removed from at least one street area to expose the street area. The exposed street area is plasma etched. The composite material coating is removed from the top surface of the substrate.

Yet another feature of the present invention is to provide a method for an improved protective coating for plasma dicing a substrate. The substrate can have a semiconducting layer such as Silicon and/or the substrate can have a III-V layer such as GaAs. A work piece having a support film, a frame and the substrate, the substrate having a top surface and a bottom surface, the top surface of the substrate having a plurality of device structures and a plurality of street areas is provided. The work piece is formed by adhering the substrate to a support film and then mounting the substrate with the support film to a frame. The support film can have a polymer layer and/or a conductive layer. The support film can be standard dicing tape. The frame can have a conductive layer and/or a metal layer. A composite material coating having a matrix component and a filler component is applied to the top surface of the substrate. The matrix component can further comprise a carbon containing material and/or a polymer material. The matrix component can be water soluble. The matrix component can further comprise a poly acrylic acid. The matrix component can further comprise dextran. The matrix component can further comprise a poly methacrylic acid. The matrix component can further comprise a poly acrylamide. The matrix component can further comprise a poly ethylene imine. The matrix component can further comprise a poly vinyl alcohol. The filler component cannot be water soluble. The filler component can further comprise a carbon containing material. The matrix component can be selected from the group consisting of graphite, diamond and silicon carbide. The filler component can further comprise a silicon containing material. The matrix component can be selected from the group consisting of silicon nitride, silicon dioxide, silicon oxynitride and silicon carbide. The filler component can further comprise particles. The composite material coating is removed from at least one street area to expose the street area. The exposed street area is plasma etched. The composite material coating is removed from the top surface of the substrate.

Still yet another feature of the present invention is to provide a method for an improved protective coating for plasma dicing a substrate. The substrate can have a semiconducting layer such as Silicon and/or the substrate can have a III-V layer such as GaAs. A work piece having a support film, a frame and the substrate, the substrate having a top surface and a bottom surface, the top surface of the substrate having a plurality of device structures and a plurality of street areas is provided. The work piece is formed by adhering the substrate to a support film and then mounting the substrate with the support film to a frame. The support film can have a polymer layer and/or a conductive layer. The support film can be standard dicing tape. The frame can have a conductive layer and/or a metal layer. A composite material coating having a matrix component and a filler component is applied to the top surface of the substrate. The filler component has a plurality of particles. The matrix component can further comprise a carbon containing material and/or a polymer material. The matrix component can be water soluble. The matrix component can further comprise a poly acrylic acid. The matrix component can further comprise dextran. The matrix component can further comprise a poly methacrylic acid. The matrix component can further comprise a poly acrylamide. The matrix component can further comprise a poly ethylene imine. The matrix component can further comprise a poly vinyl alcohol. The filler component cannot be water soluble. The filler component can further comprise a carbon containing material. The matrix component can be selected from the group consisting of graphite, diamond and silicon carbide. The filler component can further comprise a silicon containing material. The matrix component can be selected from the group consisting of silicon nitride, silicon dioxide, silicon oxynitride and silicon carbide. The composite material coating is removed from at least one street area to expose the street area. The exposed street area is plasma etched. The composite material coating is removed from the top surface of the substrate.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF THE INVENTION

Figure 1:
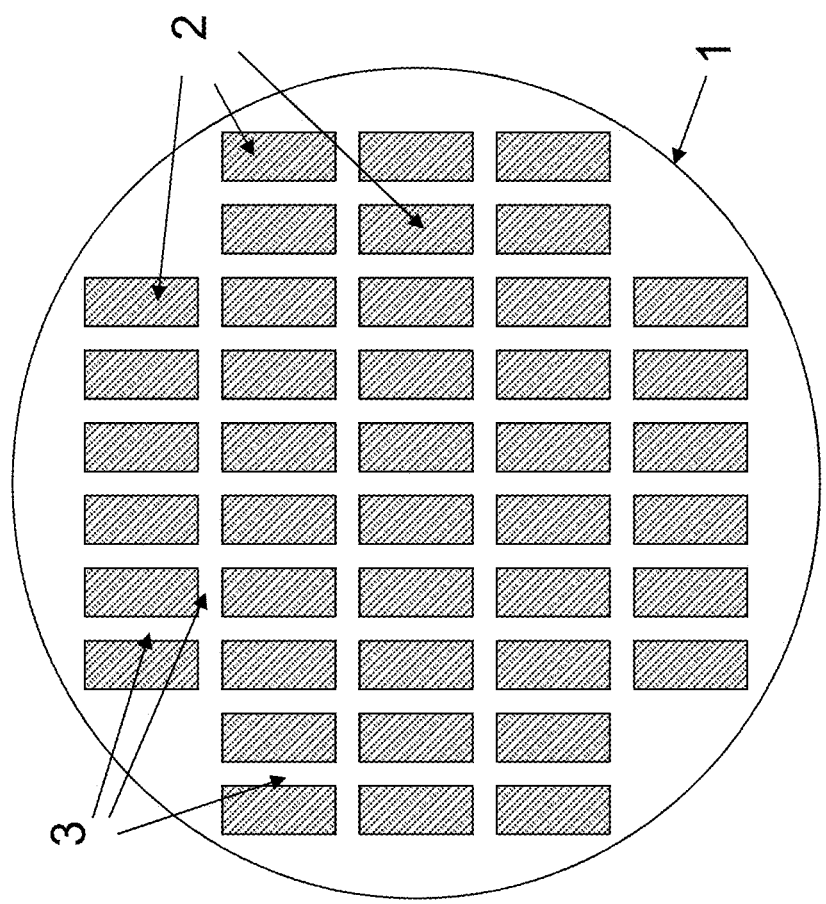
FIG. 1 is a top down view of a semiconductor substrate illustrating individual devices separated by streets.

A typical semiconductor substrate after device fabrication is illustrated in FIG. 1. The substrate (1) has on its surface a number of areas containing device structures (2) separated by street areas (3) in which there are no structures which allows for separation of the device structures into individual die. Although silicon is commonly used as a substrate material, other materials chosen for their particular characteristics are frequently employed. Such substrate materials include gallium arsenide and other III-V materials or non-semiconductor substrates on which a semi-conducting layer has been deposited.

Figure 2:
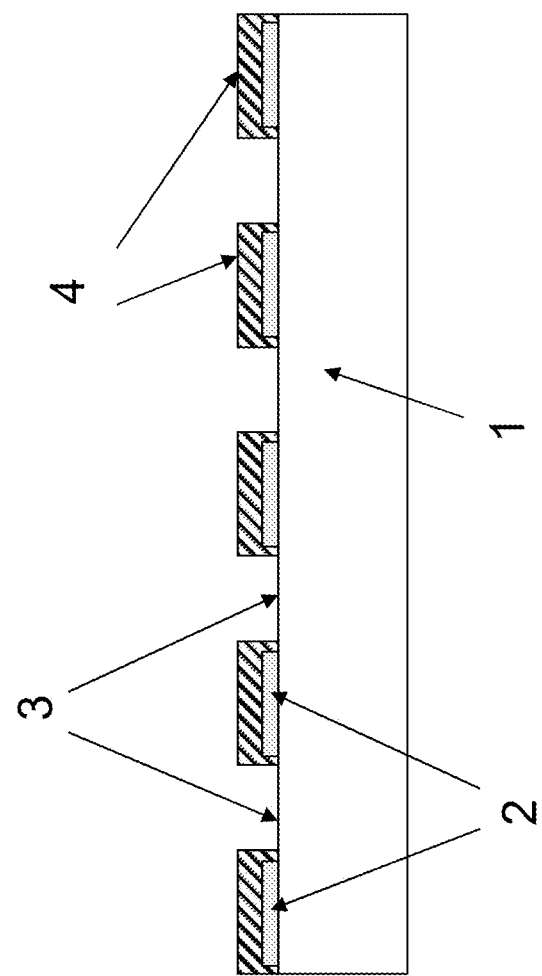
FIG. 2 is a cross-sectional view of a semiconductor substrate illustrating individual devices separated by streets.

In the present invention, as is shown in a cross sectional view in FIG. 2, a substrate (1) having a plurality of device structures (2) and street areas (3) has been covered with a composite material coating (4). The composite material coating (4) is removed from the street areas (3) to expose the street areas (3) while leaving the device structures (2) protected by the composite material coating (4). Although the device pattern illustrated shows oblong die, this is not necessary, and the individual device structures (2) may be any other shape, such as hexagons, as best suits the optimum utilization of the substrate (1).

Figure 3:
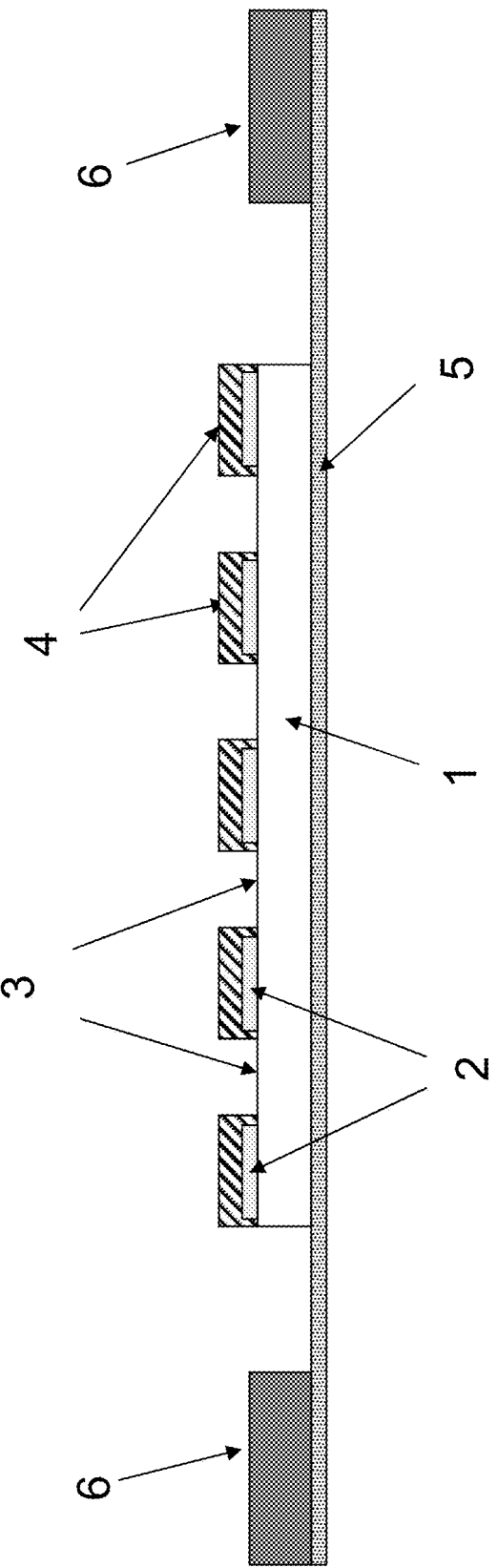
FIG. 3 is a cross-sectional view of a semiconductor substrate mounted to tape and a frame.

The substrate (1) is thinned, typically by a grinding process, which reduces the substrate thickness to a few hundred microns to as thin as 50 microns. As is shown in FIG. 3, the thinned substrate (1) is then adhered to a tape (5) which in turn is mounted in a rigid frame (6) to form a work piece (1A). The tape (5) is typically made from a Carbon containing polymer material, and may additionally have a thin conductive layer applied to its surface. The tape (5) provides support for the thinned substrate (1) which is otherwise too fragile to handle without breakage. It should be noted that the sequence of patterning, thinning and then mounting is not critical and the steps may be adjusted to best fit the particular devices and substrate and the processing equipment used.

Figure 4:
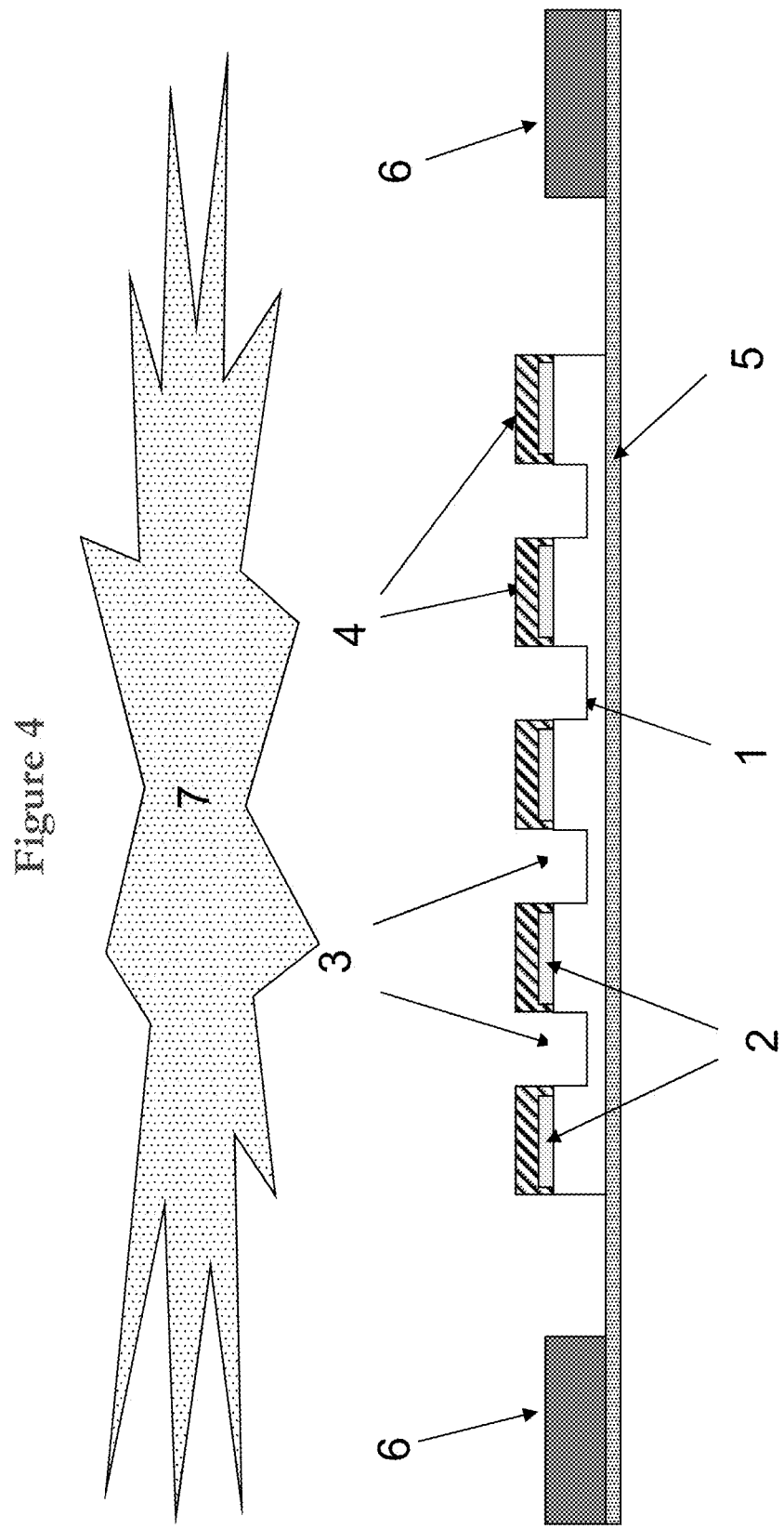
FIG. 4 is a cross-sectional view of a semiconductor substrate mounted to tape and a frame being etched by a plasma process.
Figure 5:
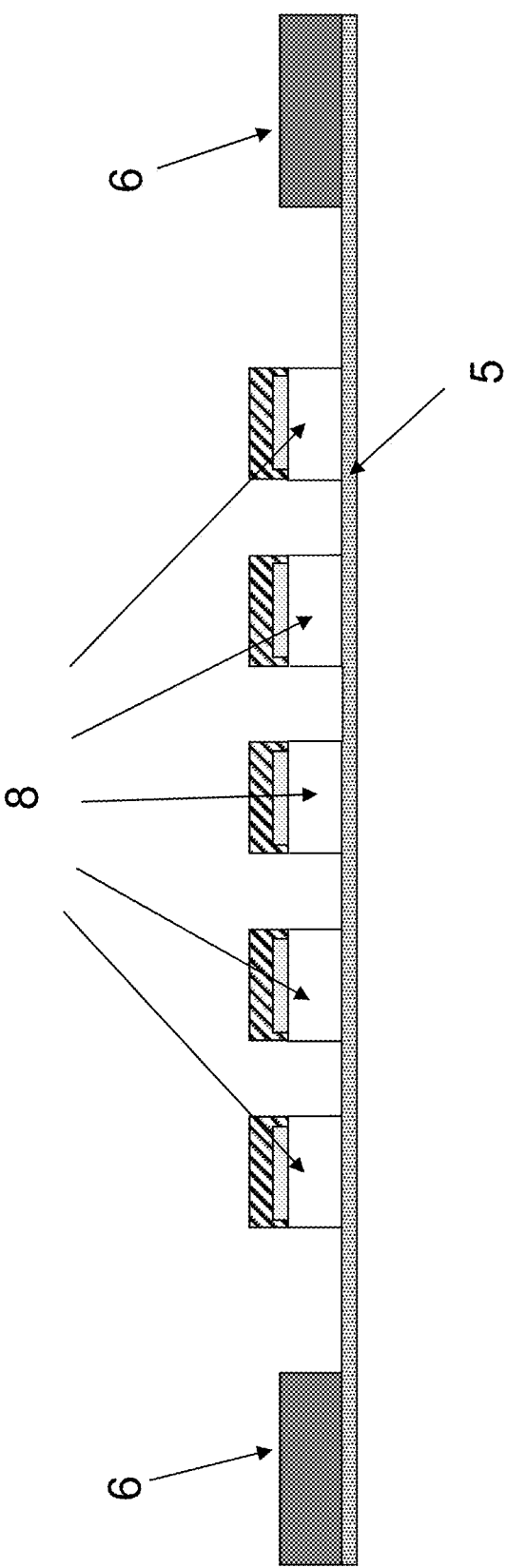
FIG. 5 is a cross-sectional view of separated semiconductor devices mounted to tape and a frame.
Figure 6:
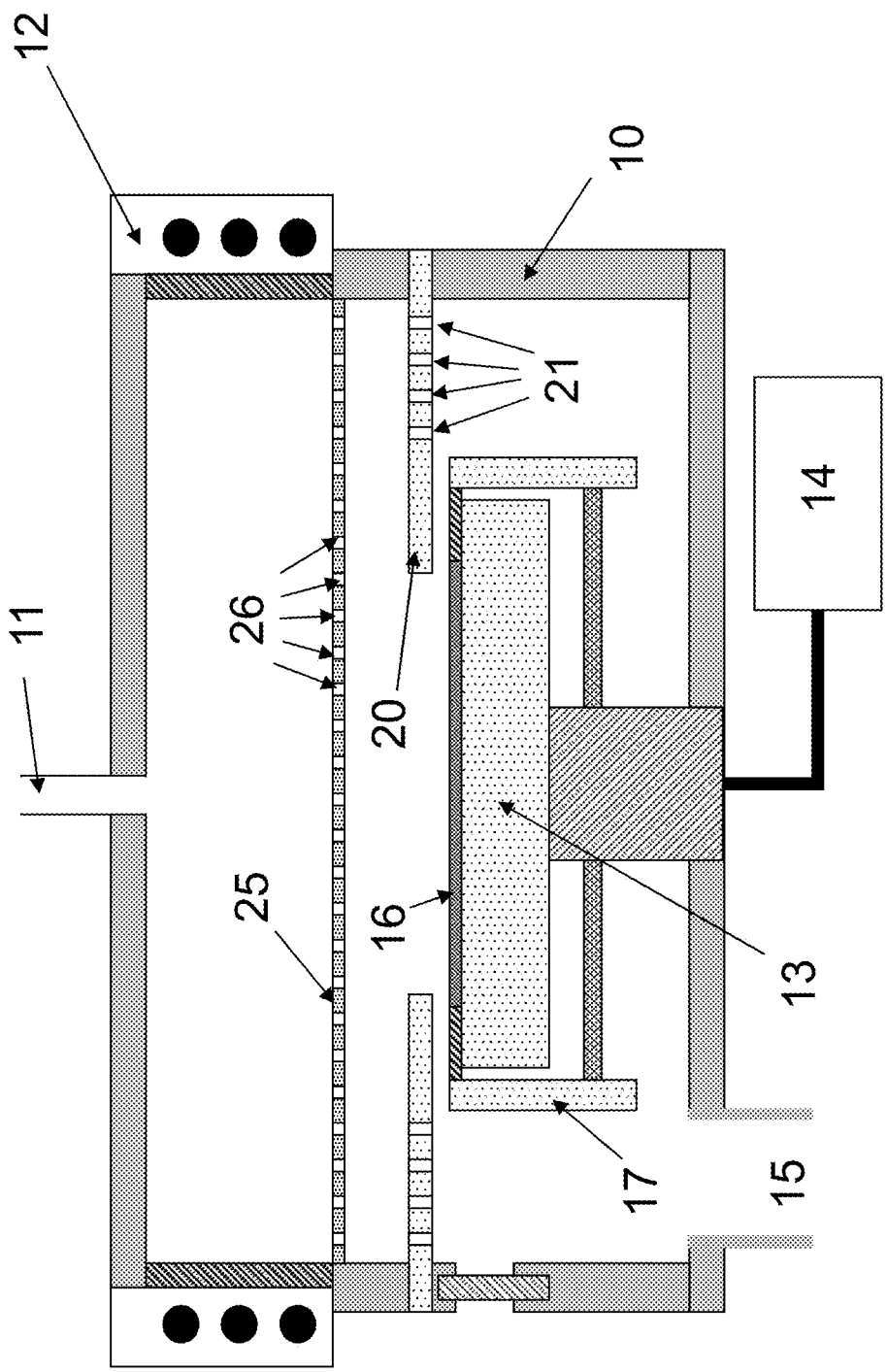
FIG. 6 is a cross-sectional view of a vacuum processing chamber.
Figure 7:
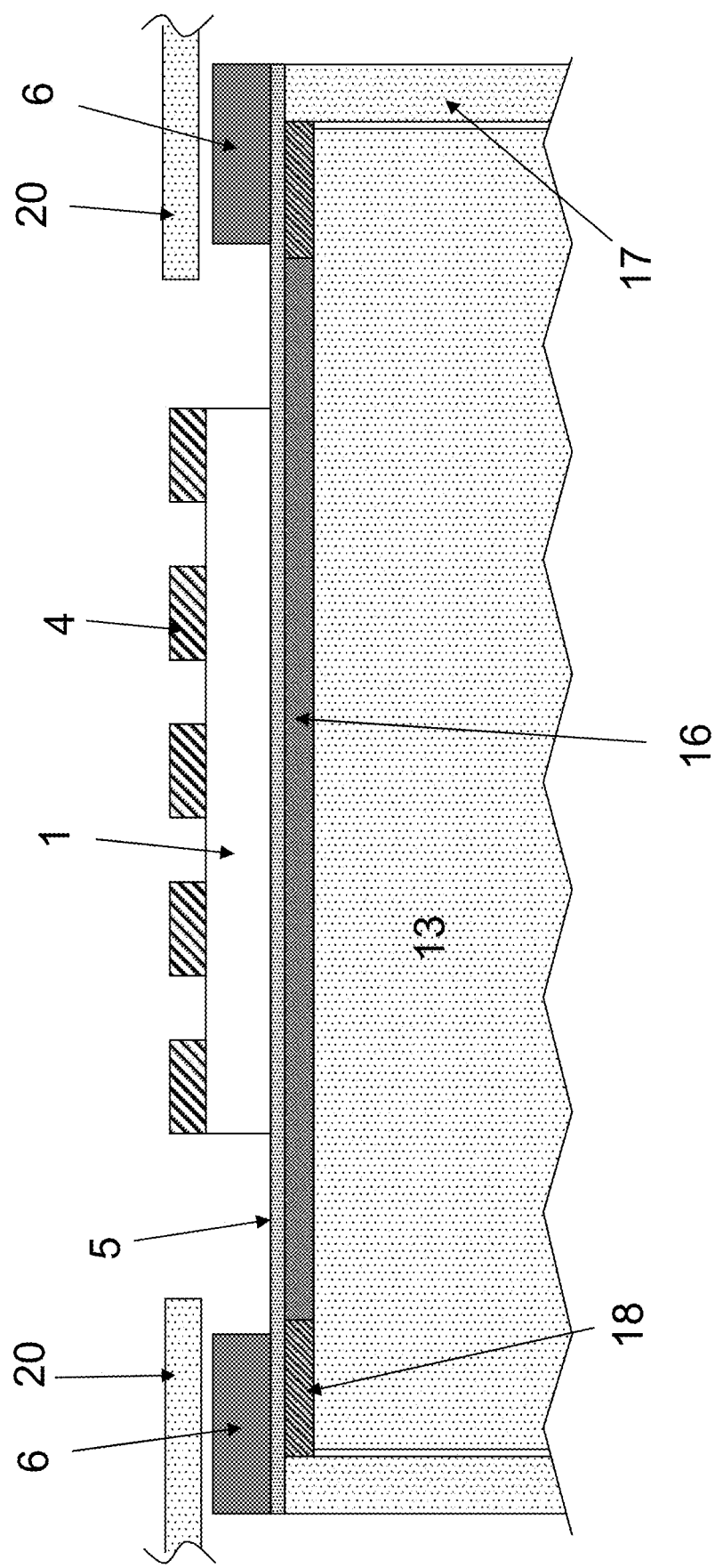
FIG. 7 is a cross-sectional of a wafer/frame in process position.

After mounting the substrate (1) with the tape (5) in the dicing frame (6), the work piece (1A) is transferred into a vacuum processing chamber. Ideally, the transfer module is also under vacuum which allows the process chamber to remain at vacuum during transfer, reducing processing time and preventing exposure of the process chamber to atmosphere and possible contamination. As shown in FIG. 6, the vacuum processing chamber (10) is equipped with a gas inlet (11), a high density plasma source (12) to generate a high density plasma, such as an Inductively Coupled Plasma (ICP), a work piece support (13) to support the work piece (1A), an RF power source (14) to couple RF power to the work piece (1A) through the work piece support (13) and a vacuum pump (15) for pumping gas from the processing chamber (10). During processing, the exposed street areas (3) of the substrate (1) are etched away using a reactive plasma etch process (7) as shown in FIG. 4. This leaves the devices separated into individual die (8) as shown in FIG. 5. The composite material (4) is removed from the top surface of the substrate (1).

The substrate can be plasma processed using techniques well known in the semiconductor industry. Silicon substrates are generally processed using a Fluorine based chemistry such as $SF_6$. $SF_6/O_2$ chemistry is commonly used to etch Silicon because of its high rate and anisotropic profile. A disadvantage of this chemistry is its relatively low selectivity to masking material for example to photoresist which is 15-20:1. Thus, the present invention uses a composite material that has a much higher selectivity than photoresist, i.e. selectivity greater than 100:1.

In one embodiment according to the present invention, the composite material coating (that can comprise a matrix component and a filler component) is applied to the top surface of the substrate. The matrix component of the composite material coating can be a carbon containing material and/or a polymer material, e.g., Hogomax which is a water soluble material. The matrix component of the composite material coating can further comprise at least one of the following: poly acrylic acid; dextran; poly methacrylic acid; poly acrylamide; poly ethylene imine; or poly vinyl alcohol. The filler component of the composite material coating can have a carbon containing material based on at least one of the following: graphite; diamond; or silicon carbide which can make the filler component not soluble in water. The filler component of the composite material coating can also have a silicon containing material based on at least one of the following: silicon nitride; silicon dioxide; silicon oxynitride; or silicon carbide.

In another embodiment according to the present invention, the composite material coating comprises a matrix component and a filler component that is applied to the top surface of the substrate. The matrix component of the composite material coating can be a carbon containing material and/or a polymer material and/or a polymer material, e.g., Hogomax which is a water soluble material. The matrix component of the composite material coating can further comprise at least one of the following: poly acrylic acid; dextran; poly methacrylic acid; poly acrylamide; poly ethylene imine; or poly vinyl alcohol. The filler component of the composite material coating can have a carbon containing material based on at least one of the following: graphite; diamond; or silicon carbide which can make the filler component not soluble in water. The filler component of the composite material coating can also have a silicon containing material based on at least one of the following: silicon nitride; silicon dioxide; silicon oxynitride; or silicon carbide.

In another embodiment according to the present invention, the composite material coating comprises a matrix component and a filler component that is applied to the top surface of the substrate. The filler component of the composite material coating contains a plurality of particles. The matrix component of the composite material coating can be a carbon containing material and/or a polymer material and/or a polymer material, e.g., Hogomax which is a water soluble material. The matrix component of the composite material coating can further comprise at least one of the following: poly acrylic acid; dextran; poly methacrylic acid; poly acrylamide; poly ethylene imine; or poly vinyl alcohol. The filler component of the composite material coating can have a carbon containing material based on at least one of the following: graphite; diamond; or silicon carbide which can make the filler component not soluble in water. The filler component of the composite material coating can also have a silicon containing material based on at least one of the following: silicon nitride; silicon dioxide; silicon oxynitride; or silicon carbide.

In any embodiment of the present invention, the plasma source can be an inductively coupled plasma (ICP) using a planar and/or helical antenna. If a planar ICP is used with the RF coil placed behind the back of the ion source, then the anode must not be placed at the back of the source. In this case, the anode can be placed half way into the source, and the best shape for the anode is a cylindrical shape with the grooved surface being parallel to the plasma chamber walls, or to another conducting plate placed parallel to the chamber wall, with the parallel surface spacing. Alternatively the ICP can be a resonant source which includes helicons or can be energized with an RF power supply having an RF frequency between 100 kHz to 100 MHz. Alternatively, the plasma source 30 can be DC powered (e.g., DC Magnetron), a capacitively coupled plasma, a surface wave plasma source, a microwave plasma source (e.g., ECR source) or a magnetically enhanced or confined plasma source.

In any embodiment of the present invention, the substrate can be semiconductor containing such as a semiconductor substrate or contains an epitaxial layer. The semiconductor substrate can be silicon containing e.g., glass or a compound semiconductor e.g., contains a group III element. The substrate can be a ceramic wafer such as Al-containing e.g., AlTiC or C-containing.

In any embodiment of the present invention, a process gas can be provided by the gas supply into the processing chamber. The process gas can contain an inert gas e.g., He, Ne, Ar, Xe, Kr.

In any embodiment of the present invention, the optical properties of the filler material of the composite material coating can be similar to the optical properties of the matrix material of the composite material coating. Alternatively, the optical properties of the filler material can be dissimilar to the optical properties of the matrix material.

In any embodiment of the present invention, the filler component of the composite material coating can further comprise particles that can range in sizes such as less than about one hundred microns or less than about one micron as measured in the particles greatest dimension.

In any embodiment of the present invention, the particles of the filler component of the composite material coating can be mono disperse in size. In addition, the particles can each have a similar shape, e.g., spheres, rods, cubes, etc, or the particles can each have a dissimilar shape.

In any embodiment of the present invention, the particles of the filler component of the composite material coating can be designed to optimize the absorption of moisture, laser radiation and/or plasma energy. This can be accomplished through material fillers that have these known attributes.

In any embodiment of the present invention, the composite material coating can be removed from the street areas by laser ablation.

In any embodiment of the present invention, the composite material coating can be removed from the top surface of the substrate using water.

In any embodiment of the present invention, the filler component of the composite material coating can have a lower plasma etch rate than the matrix component of the composite material.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for an improved protective coating for plasma dicing a substrate, the method comprising:
    providing a work piece having a support film, a frame and the substrate, the substrate having a top surface and a bottom surface, the top surface of the substrate having a plurality of device structures and a plurality of street areas;
    applying a composite material coating to the top surface of the substrate, the composite material coating further comprising a matrix component and a filler component, the filler component having a lower plasma etch rate than the matrix component;
    removing said composite material coating from at least one street area to expose the street area;
    placing the work piece with the at least one exposed street area into a vacuum chamber;
    igniting a plasma in the vacuum chamber;
    plasma etching the exposed street area with said composite coating over the plurality of device structures; and
    removing said composite material coating from the top surface of the substrate.

2. The method according to claim 1 wherein said matrix component further comprising a carbon containing material.

3. The method according to claim 1 wherein said matrix component further comprising a polymer.

4. The method according to claim 1 wherein said matrix component is water soluble.

5. The method according to claim 4 wherein said matrix component further comprising a polyacrylic acid.

6. The method according to claim 5 wherein said matrix component further comprising dextran.

7. The method according to claim 6 wherein said matrix component further comprising a polymethacrylic acid.

8. The method according to claim 7 wherein said matrix component further comprising a polyacrylamide.

9. The method according to claim 8 wherein said matrix component further comprising a polyethylene imine.

10. The method according to claim 9 wherein said matrix component further comprising a polyvinyl alcohol.

11. The method according to claim 1 wherein said filler component is not water soluble.

12. The method according to claim 1 wherein said filler component further comprising a carbon containing material.

13. The method according to claim 12 wherein said matrix component is selected from the group consisting of graphite, diamond and silicon carbide.

14. The method according to claim 1 wherein said filler component further comprising a silicon containing material.

15. The method according to claim 14 wherein said matrix component is selected from the group consisting of silicon nitride, silicon dioxide, silicon oxynitride and silicon carbide.

16. The method according to claim 1 wherein said filler component further comprising particles.

* * * * *